United States Patent [19]

Fukase

[11] Patent Number: 5,384,287

[45] Date of Patent: Jan. 24, 1995

[54] METHOD OF FORMING A SEMICONDUCTOR DEVICE HAVING SELF-ALIGNED CONTACT HOLES

[75] Inventor: Tadashi Fukase, Tokyo, Japan

[73] Assignee: NEC Corporation, Japan

[21] Appl. No.: 989,349

[22] Filed: Dec. 11, 1992

[30] Foreign Application Priority Data

Dec. 13, 1991 [JP] Japan ................................. 3-329209

[51] Int. Cl.⁶ ..................... H01L 21/265; H01L 21/70
[52] U.S. Cl. ...................................... 437/228; 437/34; 437/31; 437/42; 437/43; 437/909; 437/913
[58] Field of Search ..................... 437/29, 31, 34, 41, 437/42, 43, 228, 909, 913; 148/DIG. 11, DIG. 53

[56] References Cited

U.S. PATENT DOCUMENTS

| | | | |
|---|---|---|---|
| 4,483,726 | 11/1984 | Isaac et al. | 148/187 |
| 4,786,609 | 11/1988 | Chen | 437/30 |
| 5,149,665 | 9/1992 | Lee | 437/43 |
| 5,196,722 | 3/1993 | Bergendahl | 257/304 |

OTHER PUBLICATIONS

Wolf et al. "Silicon Processing for the VLSI EPA", vol. 1, Lattice Press, Sunset Beach, Calif., pp. 547–551 (1986).

Wolf et al., "Silicon Processing for the VLSI EPA vol. 2" Lattice Press, Sunset Beach, Calif., pp. 327–335 (1990).

Fukumoto et al., IEICE Transactions, vol. E 74, No. 4, Apr. 1991, pp. 818–825.

*Primary Examiner*—Olik Chaudhuri
*Assistant Examiner*—Ken Horton
*Attorney, Agent, or Firm*—Laff, Whitesel, Conte & Saret, Ltd.

[57] ABSTRACT

At the surface of a semiconductor substrate a conductor film over a silicon comprising insulating film, and the first aluminium oxide film are formed. These films are patterned to form a plurality of lines and an aluminium oxide film mask covering the top faces of the lines. Over the whole surface, the second aluminium oxide film is formed and etched back to form aluminium oxide film spacers covering the side faces of the lines. Over the whole surface a silicon oxide comprising dielectric film is formed. Anisotropic dry etching of the dielectric film and the insulating film is performed with fluorocarbon comprising gas to form self-aligned contact holes extending down to the surface of diffused layers formed at the surface of the semiconductor substrate. The self-aligned contact holes can be formed to be self-aligned with two adjacent lines because silicon-comprising dielectric films have a high etching selectivity to anisotropic dry etching with fluorocarbon-comprising gas, compared with aluminium oxide film. Isolation between the self-aligned contact hole and the interconnect is made only by aluminium oxide film spacers, resulting in suitably minimized area of the self-aligned contact holes. Besides isolation between the lines and the interconnects filling the self-aligned contact holes, and between two interconnects each filling the neighboring self-aligned contact holes, respectively, can be well secured.

3 Claims, 11 Drawing Sheets

METHOD OF FORMING A SEMICONDUCTOR DEVICE HAVING SELF-ALIGNED CONTACT HOLES

BACKGROUND OF THE INVENTION

1. Field of the Invention

This invention relates to a method of forming a semiconductor device having self-aligned contact holes, particularly for interconnecting lines and diffused layers.

2. Description of the Prior Art

For scaling down of semiconductor devices, scaling down of lines and diffused layers in a semiconductor device, and multilevel interconnection structure are primarily needed. Scaling down of areas required for contact holes for interconnecting lines and diffused layers is essential, too. Diffused layers and the first-level lines are isolated by intermediation of insulating film such as silicon oxide film. The upper- and lower-level lines are isolated by intermediation of dielectric film such as silicon oxide film, PSG film or BPSG film. A contact hole interconnecting a diffused layer and the first-level line is formed to extend through the insulating film. A contact hole for direct connection between a diffused layer and a second or higher level line is formed with need of extending the insulating film and at least one dielectric film. These contact holes are required to have a large diameter not so as to increase electric resistance, and to minimize their areas. For this it is preferable for the margin between the contact hole and the diffused layer, {(the width of the diffused layer—diameter of the exposed surface of the diffused layer through the contact hole)/2}, to be small, at least 0. For particularly the contact hole connecting directly between a diffused layer and a second or higher level line, it is important to hold the margin to be minimized because it must be formed with need of bypassing the lower lines.

For example, in a semiconductor device containing MOS transistors, the first level lines are gate electrodes, and the diffused layers which are source and drain regions of a MOS transistor are formed to be self-aligned with a gate electrode and field oxide films. Therefore, the contact hole connecting directly between the diffused layer and the second or higher level line is formed to bypass the gate electrode. Thus a self-aligned contact hole needing minimized area has been proposed.

The structure of the self-aligned contact hole is summarized in the following by an example formed in a MOS transistor. The same respect for self-aligned and conventional contact holes directly interconnecting an upper line and a diffused layer resides in, first extending through one or more dielectric films down to a diffused layer and to bypass gate electrodes, and second, being filled with interconnect. The self-aligned contact hole is distinct from the conventional contact hole in the respect that the exposed surface of the diffused layer through the contact hole is self-aligned with the gate electrodes. Strictly speaking, the upper-level interconnect filling the self-aligned contact hole and the gate electrode must be isolated from each other, and hence the exposed surface of the diffused layer through the self-aligned contact hole has been self-aligned at a predetermined distance with respect to the gate electrodes. The gate electrodes and the self-aligned contact hole are isolated by intermediation of one of more specified insulating films each having a predetermined thickness.

Two typical method of forming self-aligned contact holes will be described under.

The first method of forming self-aligned contact holes is reported in IEICE (The Institute of Electronics, Information and Communication Engineers, JAPAN) TRANSACTIONS Vol. E74, No. 4 (April), pp. 818-826, 1991, in which in a DRAM containing information storage stacked capacitors the second-level lines are formed as bit lines, and the connection between one of them and one diffused layer of the source and drain regions is made through the self-aligned contact hole. The processing sequence of this method is as follows:

At the surface of a p-type silicon substrate are formed field oxide films and gate oxide films. Over the entire surface is formed a polysilicon film, and then thereover an about 250 nm-thick silicon oxide film is formed. These are patterned to form gate electrodes (word lines) of polysilicon film, and a silicon oxide film mask which covers the top faces of the gate electrodes. Ion implantation is performed using the silicon oxide mask, the gate electrodes and the field oxide films as masks to produce lightly-doped n-type diffused layers at the surface of the silicon substrate. Over the entire surface a silicon oxide film of 200 nm thick is formed and etched back to form silicon oxide film spacers covering the side faces of each gate electrode. Then the portions of the gate oxide film remaining uncovered with the silicon oxide film spacers and the gate electrodes are removed.

In the next step, over the whole surface an about 50 nm-thick silicon oxide film (HTO film) is formed by high temperature CVD technique, and then ion implantation is carried out using the silicon oxide film spacers, the silicon oxide film, the gate electrodes and the field oxide films as masks to produce diffused layers (source/drain regions) each comprising a lightly-doped n-type region and a high-doped n-type region. Over the whole surface is formed an about 20 nm thick silicon nitride film, over the entire surface of which a dielectric film made from BPSG.

In the next step, a photoresist film is formed which is provided windows by means of each an opened portion is to be created on either diffused layer of the source and drain regions. Using this photoresist film as mask, the BPSG film is wet-etched with a buffered hydrofluoric acid. For this wet-etching, the silicon nitride film serves as an etching stopper. Subsequently using this photoresist film as mask, anisotropic dry etching of silicon nitride film 244 and HTO film are carried out with the same fluorocarbon-related etching gas, thereby self-aligned contact hole being opened (FIG. 1C). After removing the photoresist film, BPSG film is reflowed.

The second method of forming self-aligned contact holes is reported in Technical Digest of IEDM, pp. 473-476, 1990, in which self-aligned contact holes are used in formation of SRAM. This method is as follows:

At the surface of a p-type silicon substrate, gate oxide films, and others, are formed, and then gate electrodes with the top face covered with silicon oxide film mask (or silicon nitride film mask) and with the side faces covered with silicon oxide film spacers is formed, and then n-type diffused layers are formed. The portions of gate oxide film uncovered with the silicon oxide film spacers and the gate electrodes. Over the whole surface is formed an aluminium oxide film, further over the whole surface of which being formed a dielectric film made from BPSG, or made of a silicon oxide film produced by CVD technique using ozone and TEOS (tetraethyl orthosilicate: $Si(OC_2H_5)_4$).

In the next step, a photoresist film is formed which is provided with windows corresponding to the surface portions to be exposed of the diffused layers, respectively. Using this photoresist film, the dielectric film is dry-etched anisotropically with a fluorocarbon-related gas. The aluminium oxide film then functions as etching stopper.

After removing photoresist film, using the dielectric film as mask, the aluminium oxide film is wet-etched with phosphoric acid ($H_3PO_4$, about 60° C.) to open self-aligned contact holes.

The first prior art method of forming self-aligned contact hole faces the following problems:

Previous to forming a dielectric film, a three-layered insulator consisting of silicon oxide film spacer, HTO film, and silicon nitride film, are built on each side face of a gate electrode. Hence there are two three-layered insulator between two gate electrodes. For this reason, as the first problem, a self-aligned contact hole results in having an about twice larger area than the thickness of the three-layered insulator. This method therefore may stand in the way of scaling down the semiconductor device. The HTO film can serve for preventing the surface of the diffused layer from being eroded by ammonia during formation of the silicon nitride film.

As described above, using the same photoresist film as used in the wet-etching of dielectric film, the silicon nitride film and HTO film are dry-etched with the same etching gas. Increment of area needed for the self-aligned contact hole, which is the first problem can be suppressed more or less, for example, by using a thinner one as this HTO film. The use of thinner HTO film gives rise to the second problem associated with this anisotropic dry etching. There is little difference in rate of anisotropic dry etching between silicon oxide film and silicon nitride film, this causing the portions of silicon oxide film spacers and silicon oxide film mask near to the top face edges of gate electrode to get susceptible to etching, with the result of degraded isolation between the portions of the gate electrode near their top face edges and the bit line formed by overfilling the self-aligned contact hole.

The second method of forming self-aligned contact holes described above faces problems: The first is similar to the problem presented by the first method: Previous to formation of a dielectric film, a two-layered insulator consisting of silicon oxide film spacer and an aluminium oxide film is formed on the side faces of a gate electrode, so that the self-aligned contact hole results in having about twice larger area than the thickness of the two-layered insulator, this standing in the way of scaling down the semiconductor device.

The second problem related to the second method is associated with wet etching of the aluminium oxide film which is the last stage for opening self-aligned contact holes. For example, two adjacent self-aligned contact holes can be formed by over-etch of aluminium oxide film using the wet etching technique, with the result of leaving a very thin aluminium oxide film between both self-aligned holes. Correspondingly degraded isolation between the interconnects filling two self-aligned contact holes results. In an extreme case, no aluminium oxide film may leave between the contact holes, so that the interconnects filling over the contact holes may make short circuit. This phenomenon apts to be caused by wet etching because of difficult detection of the end point of the latter. Furthermore, etching the aluminium oxide film by wet etching is carried out for avoiding the phenomenon that the aluminium oxide film is formed under the contact directly with the diffused layers where self-aligned contact holes are formed, and hence it is not preferable to perform, for example, by dry etching with a chlorine-relative, the removal of these portions of the aluminium oxide film. Dry etching with a chlorine-relative can cause the surfaces of the diffused layers to be eroded.

There is another problem common to the first and second methods of forming self-aligned contact holes. These, which are methods of forming self-aligned contact holes with the first-level line. It however is difficult to build three or more levels of interconnection structure by an widened application of these methods so that self-aligned contact holes may be formed simultaneously with respect to at least two levels of lines. In other words, in this case, a plurality of alternating etchings of dielectric films and stopper films for the etchings made as from silicon nitride or aluminium oxide is needed. For this series of etchings, the silicon oxide film spacers formed on the side faces of each line become smaller in thickness with lowering level. This reflects larger susceptibility to degradation of isolation between the interconnect filling the self-aligned contact hole and the lower-level interconnect. It is noteworthy that danger of short circuit increases between interconnect filling the self-aligned contact hole and one level lower lines. As described above the first and second methods are concluded to have low effects on three- or more level-interconnect structure.

BRIEF SUMMARY OF THE INVENTION

Objects of the Invention

It is an object of the present invention to provide a method of forming self-aligned contact holes for direct connection between upper-level lines and diffused layers in a semiconductor device.

Another object of the present invention is to provide a method of forming self-aligned contact holes for direct connection between upper lines and diffused layers in a semiconductor device containing small scale diffused layers and small scale multilevel interconnection structure.

A further object of the present invention is to provide a method of forming self-aligned contact holes for direct connection between upper lines and diffused layers in a semiconductor device containing small scale diffused layers and small scale multilevel interconnection structure, with security that no degradation in isolation between lines occurs.

A further object of the present invention is to provide a method of forming self-aligned contact holes for direct connection between upper lines and diffused layers in a semiconductor device containing small scale diffused layers and small scale multilevel interconnection structure, with security that no degradation in isolation between lines occurs, and being allowed to apply to three- or more-levels interconnection structures, as well.

SUMMARY OF THE INVENTION

A method of forming self-aligned control holes according to the present invention comprises forming, at the surface of a semiconductor substrate, a conductor film through intermediation of silicon-related insulating films, and an aluminium oxide films as a mask; patterning said aluminium oxide film as a mask and said conductor film into one and the same predetermined geometry to form lines made of said conductor film, each line provided on the top with a mask made of said aluminium oxide film; forming over the whole surface, and etching back, an aluminium oxide film to form aluminium oxide film spacers on the side faces of each line; forming diffused layers of a predetermined conductivity type in predetermined regions at the surface of said semiconductor substrate; and forming over the whole surface a silicon oxide-related dielectric film and then performing anisotropic dry etching said dielectric film with fluorocarbon-related gas to form self-aligned contact holes extending down to said diffused layers.

A preferred embodiment further comprises, after forming said dielectric film, etching in sequence said dielectric film and said aluminium oxide film mask to form contact holes extending down to said lines.

Another preferred embodiment further comprises forming windows in predetermined areas in said aluminium oxide film as a mask so that said lines are formed through said windows; and performing anisotropic dry etching with a fluorocarbon-related gas to form simultaneously self-aligned contact holes extending down to said interconnects and said self-aligned contact holes extending down to said interconnect through said windows.

Another preferred embodiment further comprises, after forming said conductor film, forming over the whole surface a silicon oxide film to be used as a mask; and patterning said aluminium oxide film as mask, said silicon oxide film as mask, and said conductor film into one and the same predetermined geometry, thereby said lines made of said conductor film, and said silicon oxide film mask and said aluminium oxide film mask on the top face of each line being formed.

In another preferred embodiment, selectively formed field oxide films and gate oxide films are made of said silicon-related insulating film, said lines are gate electrodes, and said diffused layers are source/drain regions formed to be self-aligned with said gate electrode and said field oxide film.

Another preferred embodiment further comprises: forming an aluminium oxide film to serve as a pad on said silicon-related insulating film; and patterning said aluminium oxide film to be formed as a mask, silicon oxide film to be formed as a mask, said conductor film, and said aluminium oxide film as said pad into one and the same predetermined geometry, thereby said interconnect made of said conductor film, said silicon oxide film mask and said aluminium oxide film mask on the top faces of said lines, and said aluminium oxide film pad on the bottom faces of said lines being formed.

By the method of forming self-aligned contact holes according to the present invention, the top face and side faces of the line are covered with aluminium oxide film mask and aluminium oxide film spacers. In the step of opening self-aligned contact holes extending down to diffused layers by anisotropic dry etching with fluorocarbon-related gas, these aluminium oxide film mask, and aluminium oxide film spacers can be little etched, and therefore can serve as good etching stopper. This contributes to good isolation between the line and the upper-level interconnect filling the self-aligned contact hole, or between two adjacent interconnects filling over self-aligned contact holes. Further previous to forming dielectric film, there may be only a single layer of aluminium oxide film as insulating film covering the interconnect, this permitting the distance between two lines to be narrow and in turn the necessary area of the self-aligned contact hole to be small compared with the prior art method. Besides the above-described interconnection structure contribures for forming interconnects to enabling easy formation of self-aligned control holes with at least two levels of lines because the etching for opening this self-aligned contact holes can be accomplished by anisotropic dry etching with a single component fluorocarbon-related gas.

BRIEF DESCRIPTION OF THE DRAWINGS

The above-mentioned and other objects, features and advantages of this invention will become more apparent by reference to the following detailed description thereof (of the invention (when) taken in conjunction with the accompanying drawings, wherein.

BRIEF DESCRIPTION OF THE PREFERRED EMBODIMENTS

Figure 1A:
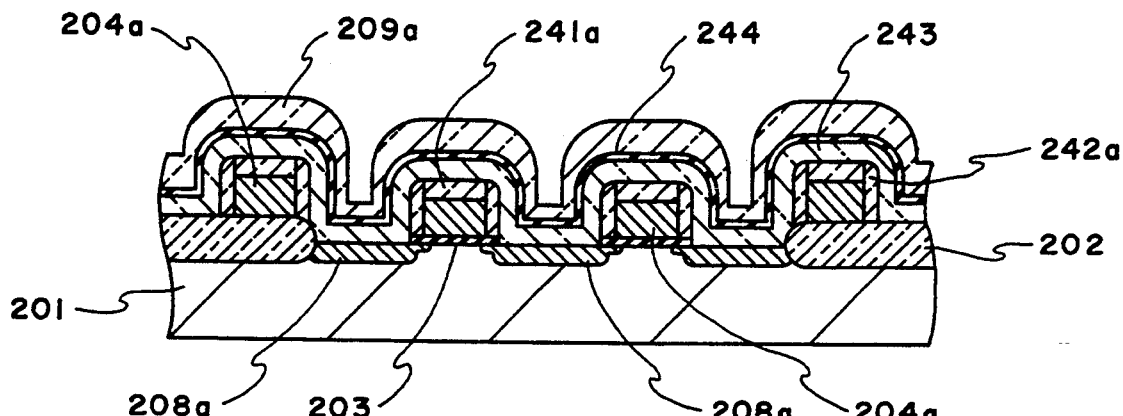
FIGS. 1A to 1D are schematic cross-sectional views for illustrating the multilevel interconnection structure in the steps of a prior art method for forming self-aligned contact holes.

Previous to description of the present invention, two typical examples involving method of forming self-aligned contact holes in the prior art will be described with reference to the accompanying drawings.

Referring to FIGS. 1A to 1D giving cross-sections illustrating the processing sequence of the first prior art method of forming self-aligned contact holes reported in IEICE TRANSACTIONS Vol. E74, No. 4 (April), pp. 818–826, 1991, which is applied to forming bit contact holes each connecting between a bit line and a diffused layer which is either source region or drain region in a DRAM having an information-storage stacked capacity. The processing sequence of this method is as follows:

At the surface of a p-type silicon substrate 201 are formed field oxide films 202 and gate oxide films 203. Over the entire surface a polysilicon film is formed, and then thereover an about 250 nm-thick silicon oxide film is formed. These are patterned to form gate electrodes (word lines) 204a of polysilicon film, and a silicon oxide film mask which covers the top faces of the gate electrodes 204a. Ion implantation is performed using silicon oxide film mask 241a, gate electrodes 204a and field oxide films 202 as masks to produce lightly-doped n-type diffused layers at the surface of the silicon substrate. Over the entire surface a silicon oxide film of 200 nm thick is formed and etched back to form silicon oxide film spacers 242a covering the side faces of each gate electrode 204a. Then the portions of gate oxide film 203 remaining uncovered with silicon oxide film spacers 242a and gate electrodes 204a are removed.

In the next step, over the whole surface an about 50 nm-thick silicon oxide (HTO) film 243 is formed by high temperature CVD technique, and then ion implantation is carried out using silicon oxide film spacers 242a, silicon oxide film 241a, gate electrodes 204a and field oxide films 202 as masks to produce diffused layers (source/drain regions) 208a each comprising a lightly-doped n-type region and a high-doped n-type region. Over the whole surface is formed an about 20 nm thick silicon nitride film 244 over the entire surface of which a dielectric film 209a made from BPSG is formed (FIG. 1A).

Figure 1B:
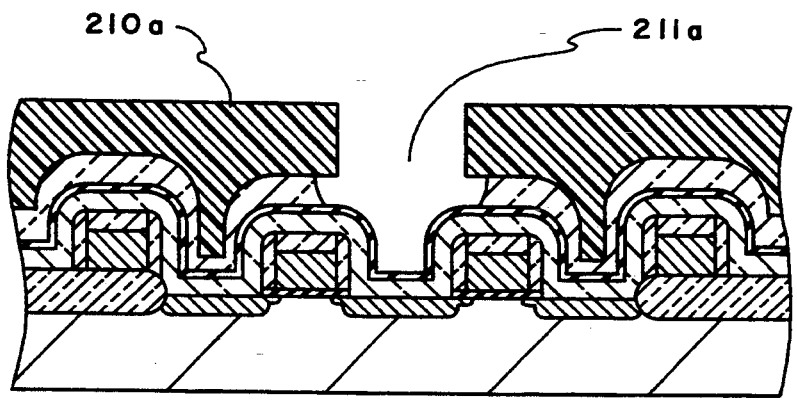
Figure 1C:
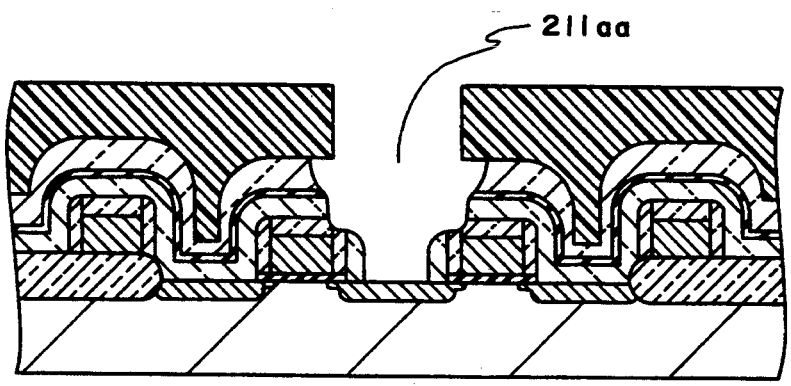
Figure 1D:
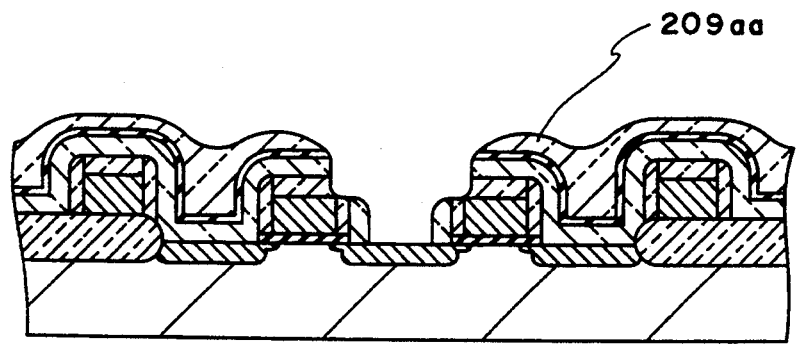

In the next step, a photoresist film 210a is formed which is provided with windows by means of each an exposed portion of a diffused layer which is either source region or drain region 208a. Using this photoresist film as mask, dielectric film 209a is wet-etched with a buffered hydrofluoric acid to form windows 211a therein (FIG. 1B). For this wet-etching, silicon nitride film 244 serves as an etching stopper. Further using this photoresist film 244 as mask, anisotropic dry etching of silicon nitride film 244 and silicon oxide film 243 are carried out with the same fluorocarbon-related etching gas, thereby self-aligned contact hole 211aa being opened (FIG. 1C). After removing the photoresist film, dielectric film 209a is reflowed to be formed into dielectric film 209aa (FIG. 1D). Besides bit lines (not shown) connected to this self-aligned contact hole 211aa are formed.

The above-described first prior art method of forming self-aligned contact holes faces the following problems: At the preceding stage where dielectric film 209a is formed, a three-layered structure consisting of silicon oxide film spacers 242a, silicon oxide (HTO) film 243 and silicon nitride film 244 is built on the side faces of each gate electrode 204a, so that as the first problem, a self-aligned contact hole 211aa results in having an about twice larger area than the thickness of the three-layered structure, this standing in the way of scaling down the semiconductor device. The second problem is associated with the anisotropic dry etching for opening self-aligned contact holes 211aa. There is little difference between anisotropic dry etching rates of silicon oxide film and silicon nitride film, this causing the portions of silicon oxide film spacer 242a and silicon oxide film mask 241a near to the top face edges of gate electrodes 204a to get susceptible to etching, with the result of degraded isolation between the portions of gate electrodes 204a (word line) near to their top face edges and the bit lines formed by overfilling the self-aligned contact holes 211aa.

Figure 2A:
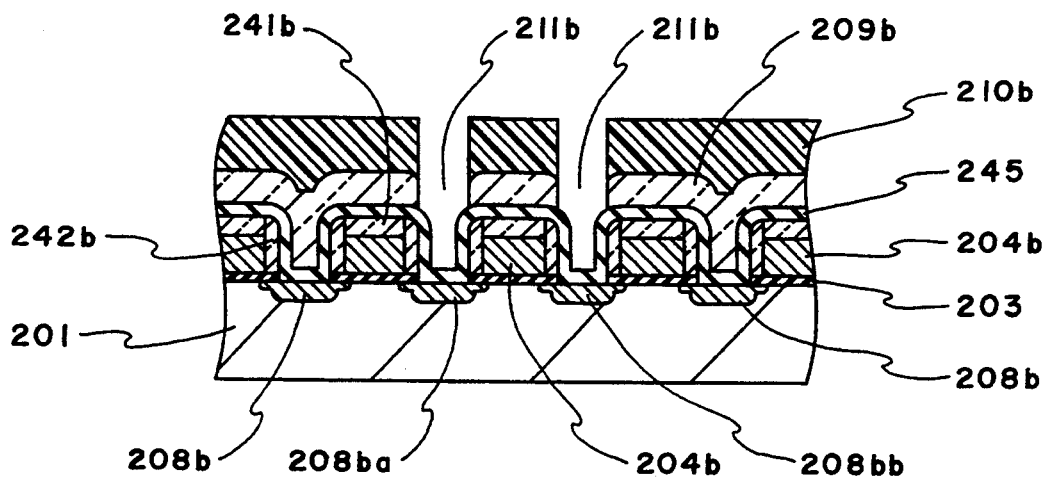
FIGS. 2A and 2B are schematic cross-sectional views for illustrating the multilevel interconnection structure in the steps of another prior art method for forming self-aligned contact holes.
Figure 2B:
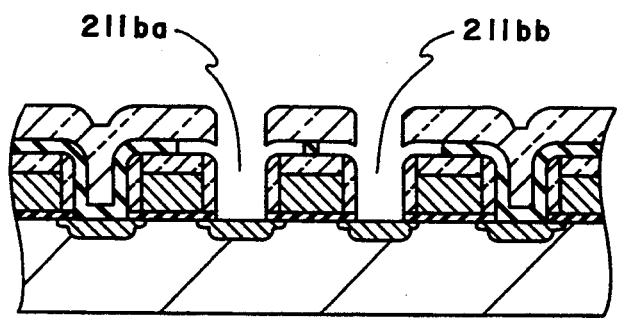

The second method of forming self-aligned contact holes in the prior art reported in Technical Digest of IEDM, pp. 473–476, 1990, which is applied to formation of contact holes in SRAM, with reference to FIGS. 2A and 2B illustrating in schematic section the processing steps of it is as follows:

On or at the surface of a p-type silicon substrate 201 are formed gate oxide film 203, and others. Additionally gate electrodes 204b with the top face covered with silicon oxide film mask 241b or silicon nitride film mask and with the side faces covered with silicon oxide film spacers 242b, and then n-type diffused layers 208b, 208a, 208bb are formed. The portions of gate oxide film 203 uncovered with silicon oxide film spacers 242b and gate electrodes 204b are removed. Over the whole surface is formed an aluminium oxide films 245, further over the whole surface of which being formed a dielectric film 209b made from BPSG, or made of a silicon oxide film produced by CVD technique using ozone and TEOS (tetraethyl orthosilicate: $Si(OC_2H_5)_4$). Additionally a photoresist film 210b is formed which is provided with windows corresponding to the surface portions to be exposed, of diffused layers 208ba and 208bb, respectively. Using photoresist film 210b, dielectric film 209b is dry-etched anisotropically with a fluorocarbon-related gas to open windows 211b (FIG. 2A). Then aluminium oxide film 245 functions as etching stopper.

After removing photoresist film 210b, using dielectric film 209b as mask, the portions of aluminium oxide film 245 exposed through windows 211b are wet-etched away with phosphoric acid ($H_3PO_4$, about 60° C.) to open self-aligned contact holes 211ba, 211bb extending down to diffused layers 208ba, 208bb (FIG. 2B).

The second prior art method of forming self-aligned contact holes described above faces problems: First, the same problem as presented by the first prior art method that because of forming two insulating layers, silicon oxide film spacer 242b and aluminium oxide film 245, on each side face of gate electrode 204b previous to forming dielectric film 209b, self-aligned contact holes 211ab, 211bb occupy such wide areas that may stand in the way of the scaling down of the semiconductor device. The second problem is associated with wet etching of aluminium oxide film 245 for opening self-aligned contact holes 211ba, 211bb. As shown, two adjacent self-aligned contact holes 211ba, 211bb can be formed by over-etch of aluminium oxide film 245 using the wet etching technique, with the result of leaving a very thin aluminium oxide film 245 between two self-aligned holes 211ba, 211b. Correspondingly lower isolation between interconnects filling the neighboring self-aligned contact holes 211b results. In an extreme case, no aluminium oxide film 245 may leave between the neighboring contact holes 211ba, 211b, so that the interconnects filling them the contact holes may make short circuit. This phenomenon apts to be caused by wet etching because of difficult detection of the end point of the latter. There is another problem common to the first and second method of forming self-aligned contact holes is that these methods is difficult to be applied to three- or more-level interconnection structure.

The present invention will be described with reference to the accompanying drawings hereinafter.

Refer to FIGS. 3A to 3D, which illustrate in section sequentially the method of forming self-aligned contact holes in a semiconductor device containing MOS transistors, the first embodiment of the present invention will be described. The 0.4 μm design rule is adopted and the alignment precision is ±0.05 μm.

Figure 3A:
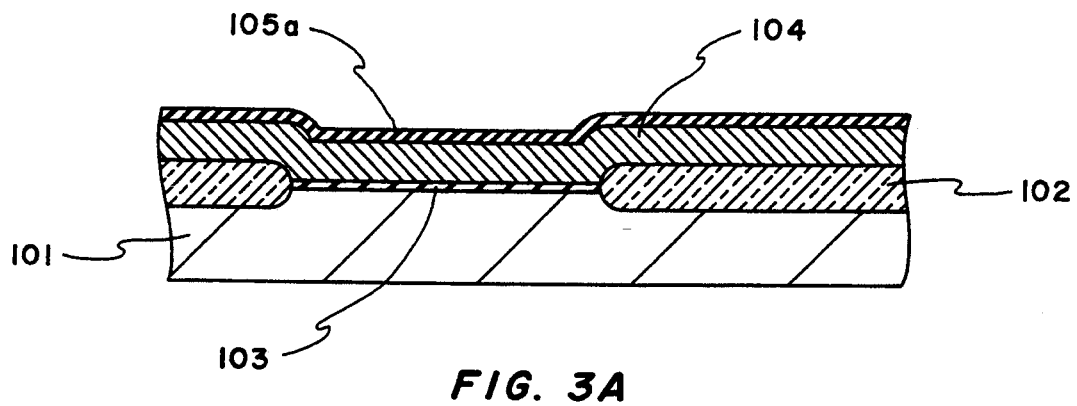
FIGS. 3A to 3D are schematic cross-sectional views for illustrating the multilevel interconnection structure in the steps in the first embodiment of the present invention.
Figure 3B:
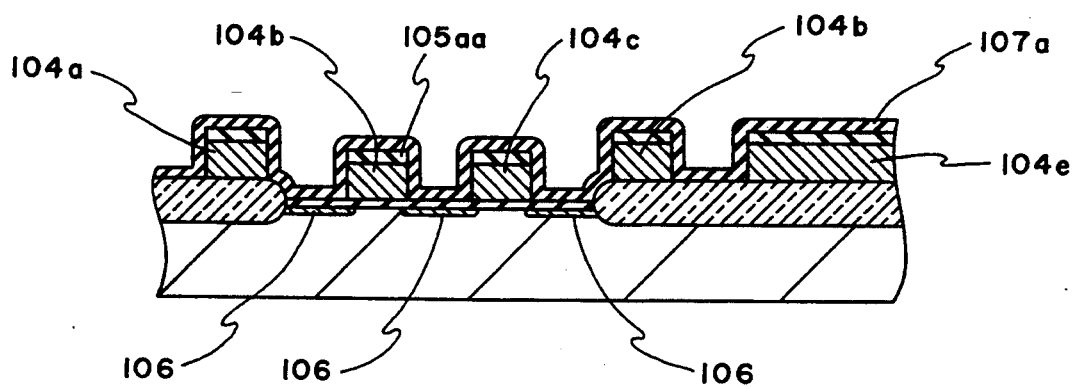

At the surface of a p-type silicon substrate 101, field oxide films 102 of about 0.5 μm thick and gate oxide films 103 of about 10 nm thick are selectively formed. On the whole surface is formed a n-type polysilicon film 104 of 200 to 250 nm, and then an aluminium oxide film 105a of about 100 nm thick to be used as a mask (FIG. 3A). The technique for forming aluminium oxide film 105a will be detailed later.

Patterning of aluminium oxide film 105a to act as mask and polysilicon film 104 are performed by etching using as a mask a photoresist film (not shown) having the same pattern as the gate electrode pattern, thereby polysilicon gate electrodes 104a, 104b, 104c, 104d, 104e and on the top faces thereof aluminium oxide film mask 105aa being formed. The etching of aluminium oxide film 105a to be used as mask is accomplished with chlorine ($Cl_2$) gas at 0° C., a pressure of 2 mTorr, and a RF power of 200 W. The etching of polysilicon film 104 is accomplished by a technique known itself. These gate electrodes are of 0.4 μm wide and located at intervals of 0.4 μm. Gate oxide films will be not removed by the series of etchings. Subsequently ion implantation is performed using as masks field oxide film 102, aluminium oxide film mask 105aa, and gate electrodes 104b, 104c to form n-type diffused layers 106 at the surface of silicon substrate 101. Over the whole surface is formed an aluminium oxide film 107a to be formed into spacers of about 100 nm (FIG. 3B) the detail of which will be given later.

In the next step, aluminium oxide film 107a to be formed into spacers is etched back, thereby aluminium oxide film spacers 107aa being formed on the side faces of each gate electrode 104a. The etch back is carried out with $BCl_3$ at 20° C., a pressure of 15 mTorr, and a RF power of 50 to 100 W. The etching rate of the aluminium oxide film with $BCl_3$ is lower than that with $Cl_2$, which can be utilized to make the detection of change in etching amount of aluminium oxide film easy. Thereby it becomes easy to leave gate oxide films 103 on the surfaces of diffused layers 106 which thus can be prevented from being eroded.

Figure 3C:
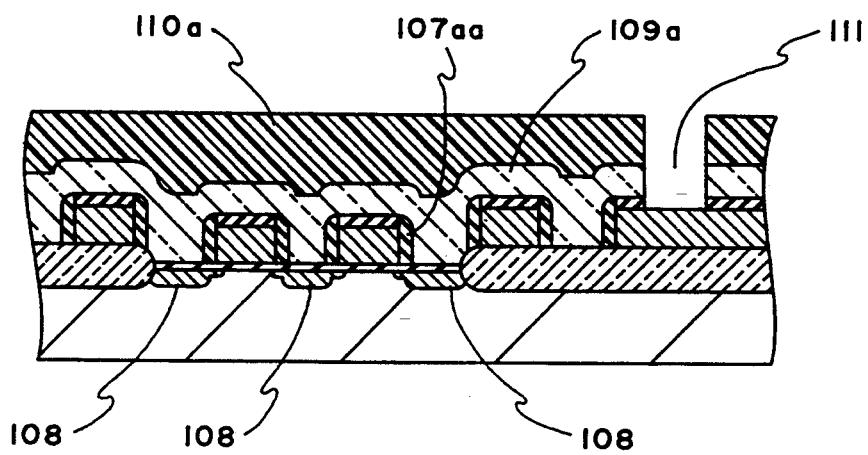

In the next step, using as masks field oxide film 102, aluminium oxide film mask 105aa, aluminium oxide film spacers 107aa, and gate electrodes 104b, 104c ion implantation doping of n-type impurity is performed at a high dose to form highly-doped n-type diffused layers which together with the above-mentioned lightly-doped n-type diffused layers constitute n-type diffused layers 108. Over the whole surface a BPSG film of 400 to 500 nm thick is deposited and reflowed to form dielectric BPSG film 109a. Subsequently using photoresist film 110a as a mask, dielectric film 109a and aluminium oxide mask 105aa are sequentially etched to open contact holes 111 extending down to gate electrodes 104e (FIG. 3C). Etching of aluminium oxide film mask 105aa for opening contact holes 111 causes somewhat erosion of the top faces of gate electrodes 104e which gives somewhat trouble, unlike the diffused layers.

Figure 3D:
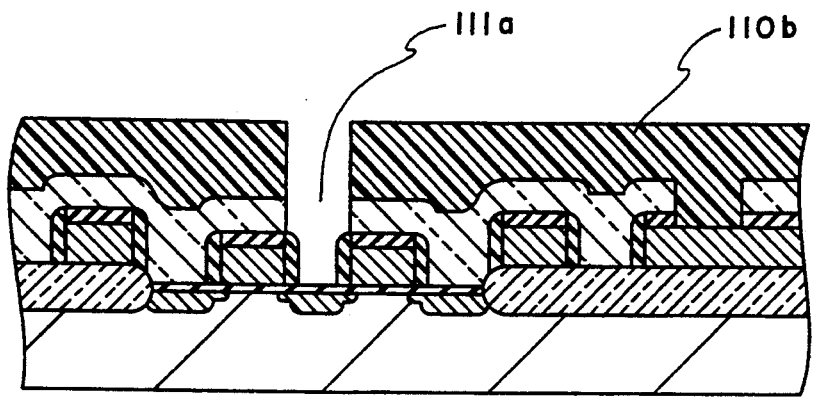

After removing photoresist film 110a, a photoresist film 110b is formed which has, for example, a window of 0.4 μm in diameter between gate electrode 104b and gate electrode 104c. Subsequently using photoresist film 110b as a mask, dielectric film 109a and gate oxide film 103 are etched, thereby a self-aligned contact hole 111a extending down to diffusion layers 108 being opened between gate electrodes 104b, 104c (FIG. 3D). This is carried out by anisotropic etching with a mixed etching gas of $CHF_3$ and $CF_4$ in ratio of 5:1 at 20° C., a pressure of 1.5 mTorr and a RF power of 100 W.

Figure 4:
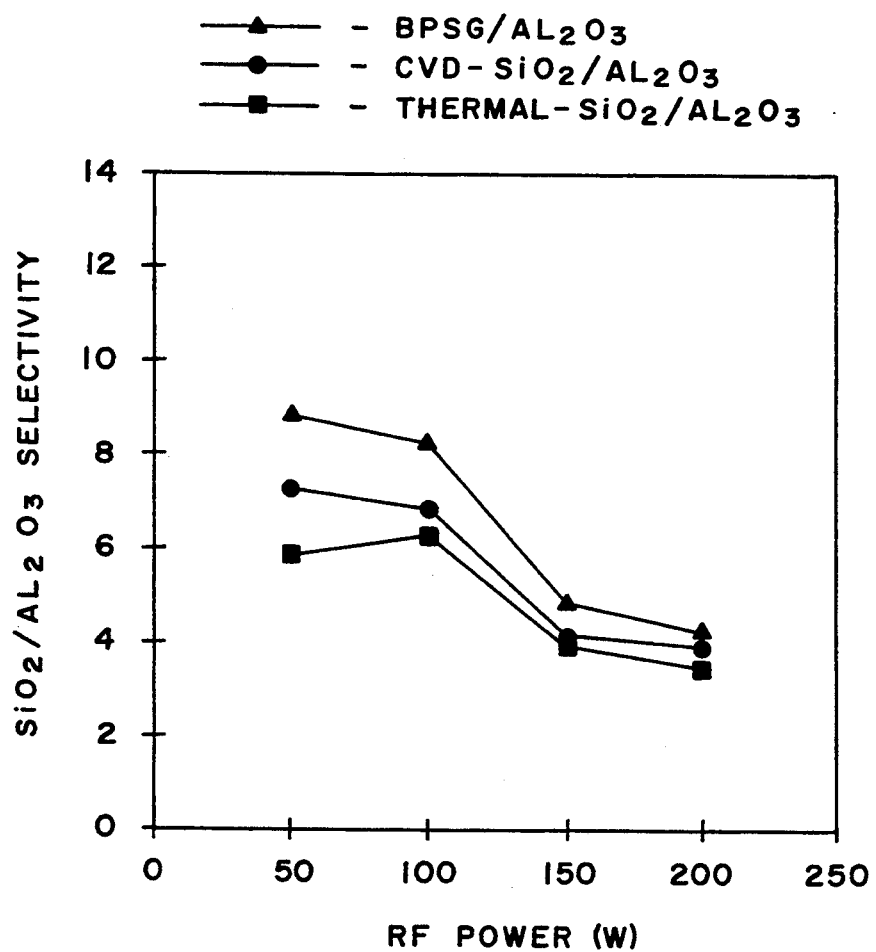
FIG. 4 is a graph plotting etching selectivities of silicon oxide-related insulating film and aluminium oxide film for illustrating etching of silicon oxide-related insulating film for use in the first embodiment with $CHF_3$ and $CH_4$.

Reference is made to FIG. 4 which shows the dependence of etching selectivity with the above-mentioned etching gas of $CHF_3$ and $CF_4$ (5:1) between silicon oxide dielectric film and aluminium oxide film on RF power. Etching for opening self-aligned contact holes 111a, because of larger etching selectivity of silicon oxide-relate dielectric film, can little etch aluminium oxide film spacers 107aa, and others. and additionally because of the absence of aluminium oxide film for covering the whole surface, can etch dielectric film 109a and gate oxide film 103 as silicon oxide-related dielectric film, and nothing else. Besides all films except silicon oxide-related dielectric film existing between two gate electrodes 104b, 104c which constitutes the lower-level lines are only aluminium oxide film spacers 107aa of about 200 nm thick in total. From these, the area of the self-aligned contact hole 111a described in this embodiment is smaller than that according to the prior art method. The interconnects which fills self-aligned contact holes 111a and which is connected to diffused layers 108 are well isolated from gate electrodes 104b, 104c by aluminium oxide film mask 105aa and aluminium oxide film spacers 107aa between them. Furthermore, because of being easily possible to cover the top faces and side faces of the upper-level lines with aluminium oxide film mask and aluminium oxide film spacers, it is possible to apply the method of forming self-aligned contact holes described in this embodiment to three- or more-level interconnection structure.

The formation of aluminium oxide film in the first embodiment described above will be described in the following:

This film can be formed by the sputtering technique under the conditions: temperature 25° C., sputtering pressure about 0.4 mTorr, Ar flow 18 sccm, and sputtering power 400 W. As another method, CVD technique can be used which is reported in Japanese Journal of Applied Physics, Vol. 30, No. 6-B, pp. L1139–L1149 (1991). According to this CVD technique, aluminium oxide is formed by the alternating flow of tri-methyl-aluminium (TMA; $Al(CH_3)_3$) of about 20 mTorr and 20 and hydrogen peroxide ($H_2O_2$) of about 20 mTorr into a reaction room maintained at about $10^{-5}$ Torr. The reaction room may be maintained at about room temperature. At 150° C. growth rate of aluminium oxide film is 7 nm/min.

Figure 5A:
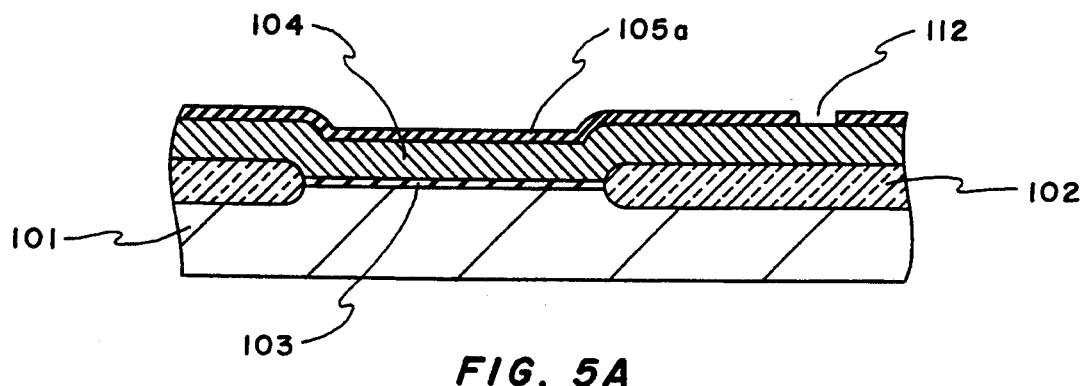
FIGS. 5A and 5B are schematic cross-sectional views for illustrating the multilevel interconnection structure in the processing steps in the second embodiment of the present invention.
Figure 5B:
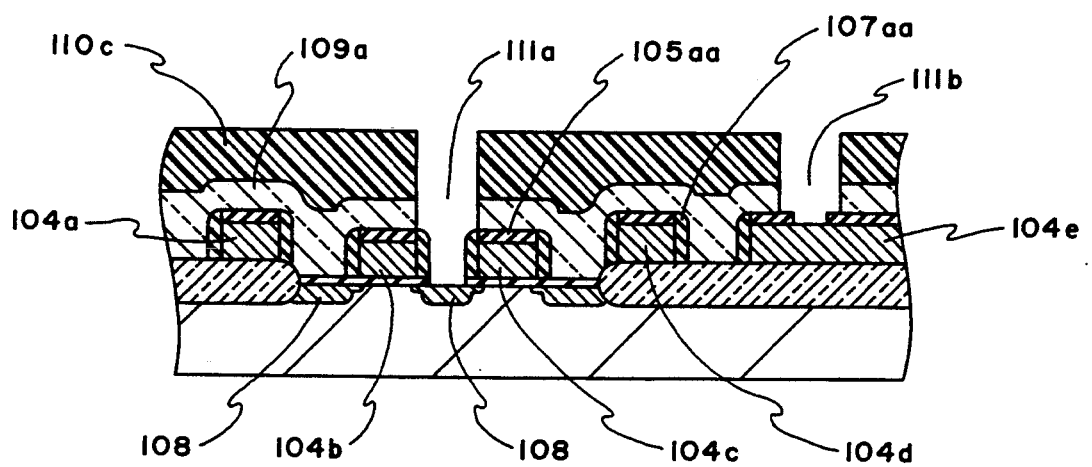

Referring to FIGS. 5A and 5B schematically illustrating in section the method of forming self-aligned contact holes, the second embodiment of the present invention, which is distinct from the above-described first embodiment in the respect that self-aligned contact holes to be filled with interconnects directly connecting to gate electrodes can be formed, will be described in the following.

The procedure till formation of a silicon oxide film 105a as a mask is made in the same way as in the first embodiment. Subsequently windows 112 are formed in aluminium film 105a, each window defining an area where the self-aligned contact hole extending down to a gate electrode on field oxide 102 is to be opened (FIG. 5A). For etching for this formation, it is preferable to use BCl$_3$.

In the next step, the procedure till formation of dielectric film 109a is made in the same way as in the first embodiment. Subsequently a photoresist film 110c is provided with windows between gate electrode 104b and gate electrode 104c and in conformity with windows 112, respectively. Using this photoresist film 110c as a mask, dielectric film 109a together with gate oxide film 103 is etched. Thereby self-aligned contact holes 111a and self-aligned contact holes 111b extending through window 112 down to gate electrodes 104e are opened (FIG. 5B). This is possible because etching of the aluminium oxide film is unneedful for it.

In comparison with the first embodiment described earlier, this embodiment not only has similar effects but also is advantageous when the top faces and side faces of the upper-level lines are covered with aluminium oxide film mask and aluminium oxide film spacers, respectively, because it has remarkable effect on scaling down the semiconductor device having multilevel interconnection structure whereas the first embodiment can not form contact holes extending to the gate electrodes as self-aligned ones.

Figure 6A:
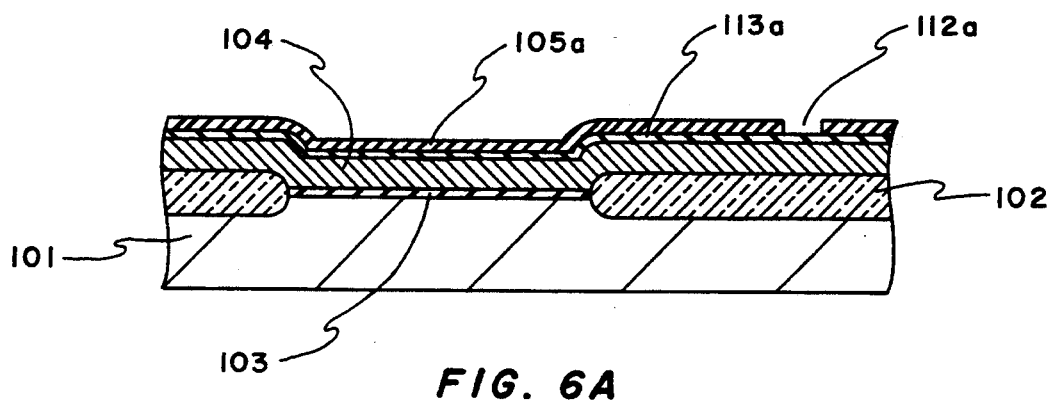
FIGS. 6A and 6B are schematic cross-sectional views for illustrating the multilevel interconnection structure in the processing steps in the third embodiment of the present invention.
Figure 6B:
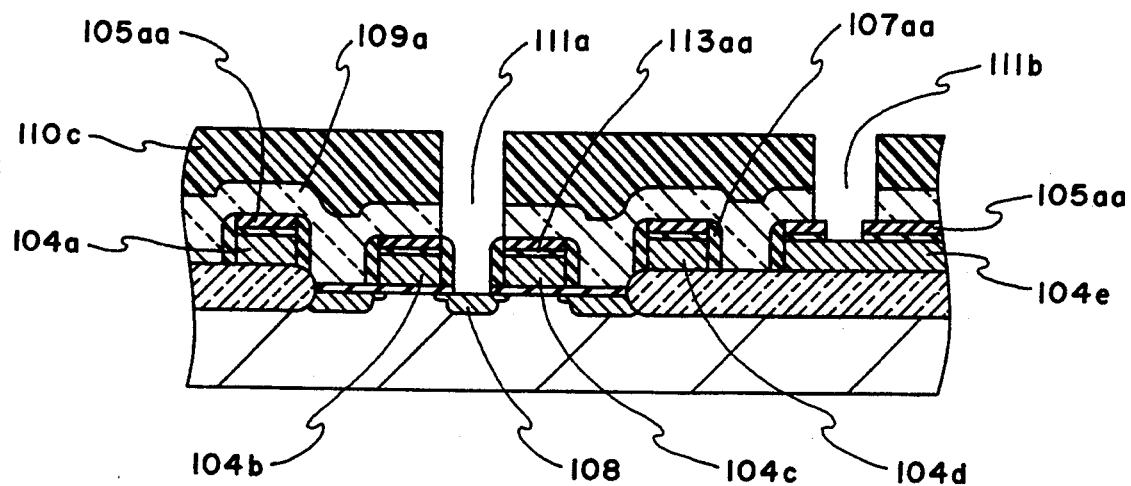

Referring to FIGS. 6A and 6B illustrating in section the processing steps, the third embodiment of the present invention will be described below.

The procedure till forming n-type pooysilicon film 104 is made in the same way as the first and second embodiments. Over the whole surface a silicon oxide film 113 of about 50 nm thick to be used as a mask is formed by thermal oxidation technique or CVD technique. Besides in the same way as the second embodiment, an aluminium oxide film 105 as a mask is formed, and therein windows 112a are opened (FIG. 6A).

In the next step, by etching using a photoresist film (not shown) as a mask, patterning of aluminum oxide film 105a as mask, silicon oxide film 113a as mask, and polysilicon film 104 is carried out, thereby gate electrodes 104a, 104b, 104c, 104d, 104e of polysilicon film being formed. Simultaneously silicon oxide film masks 113aa and aluminium oxide film masks 105aa are formed. The subsequent procedure till forming a photoresist film 110c proceeds in the same way as in the second embodiment described earlier. Using this photoresist film 110c as a mask, dielectric film 109a, silicon oxide film mask 113aa, and gate oxide film 103 are etched, and thereby self-aligned contact hole 111b extending, through self-aligned contact hole 111a and window 112a, down to gate electrode 104e is opened (FIG. 6B).

The third embodiment not only has the effects of the second embodiment but also effect of being possible to well prevent polysilicon film 104 from being eroded during etching aluminum oxide film 105a as mask for forming windows 112a. These makes this embodiment very advantageous when a metal film, such as aluminum film, having a high etching rate with chlorine-related gas is used as a conductor film which is material for making interconnections.

Example to which the third embodiment is applied will be described with reference to the drawings below.

Figure 7:
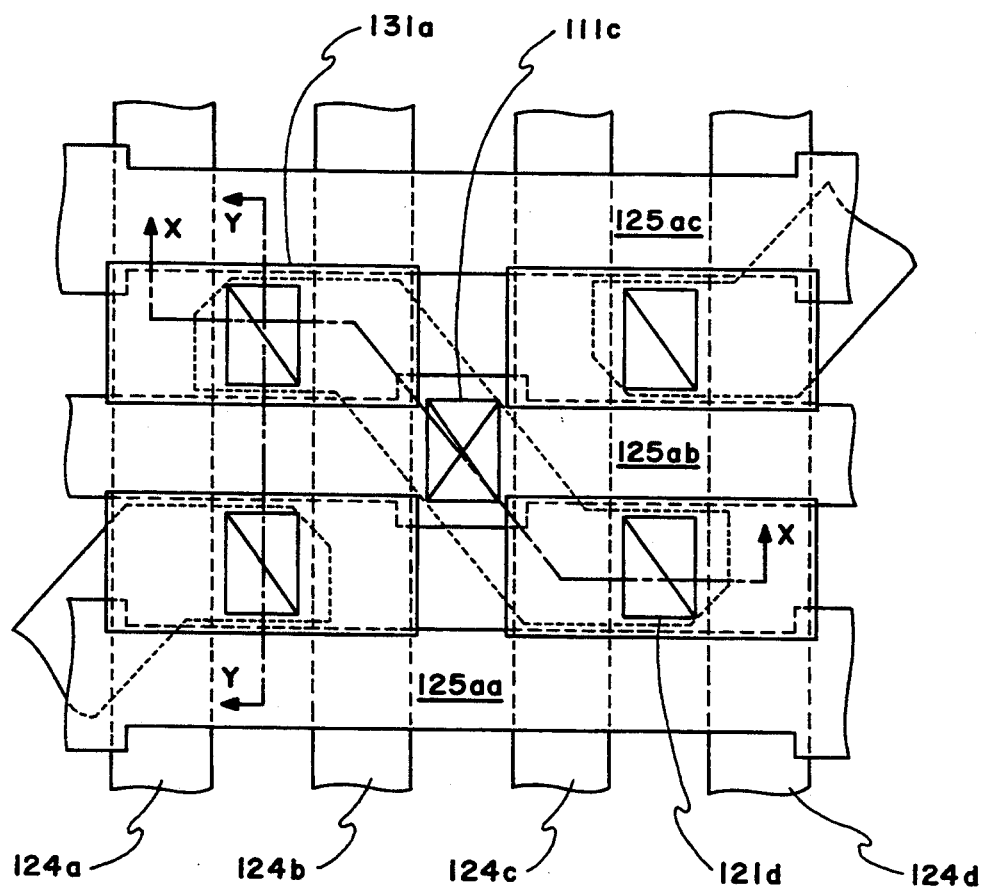
FIG. 7 is a fragmentary plan view of a semiconductor device as the first example to which the third embodiment is applied.
Figure 8A:
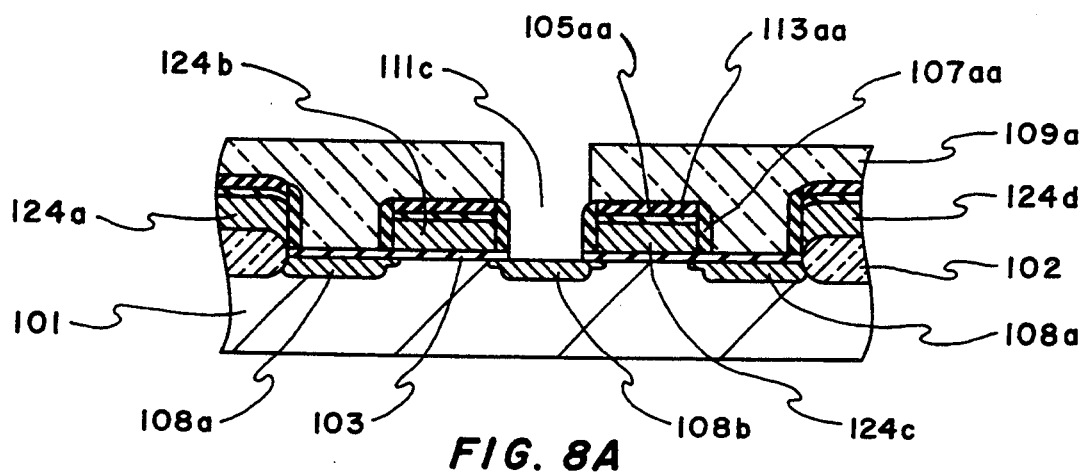
FIGS. 8A to 8C are schematic cross-sectional views for illustrating the processing steps of the semiconductor in the first application example taken along line X—X of FIG. 7.
Figure 8B:
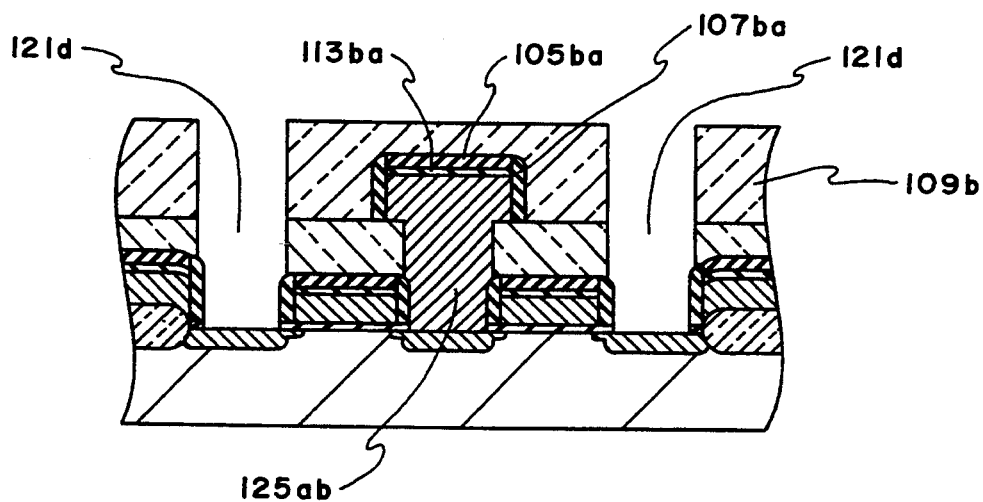
Figure 8C:
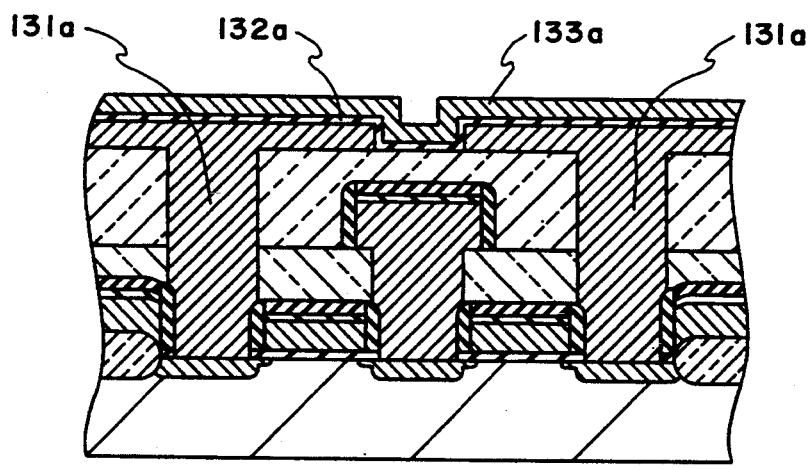

Reference is made to FIG. 7 illustrating this embodiment is schematic plan view, FIGS. 8A to 8C in fragmentary cross-sectional view along line X—X of FIG. 7, and FIGS. 9A to 9C in fragmentary cross-sectional view along line Y—Y of FIG. 7. The first example of applying the third embodiment to a DRAM with information-storage stacked capacitor, where node contact holes and bit contact holes are self-aligned ones, bit lines being at the second-level, comprises the following steps.

Figure 9A:
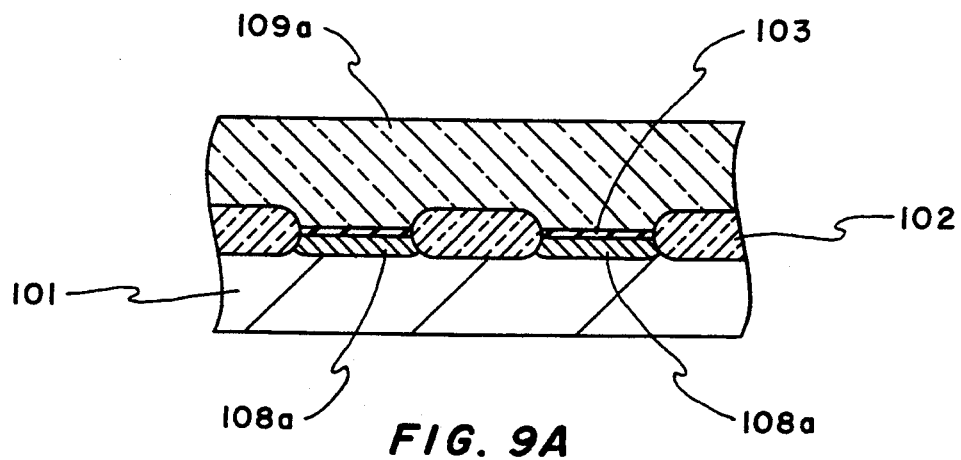
FIGS. 9A to 9C are schematic cross-sectional views for illustrating the processing steps of the semiconductor device in the first application example, taken along line Y—Y of FIG. 7.
Figure 9B:
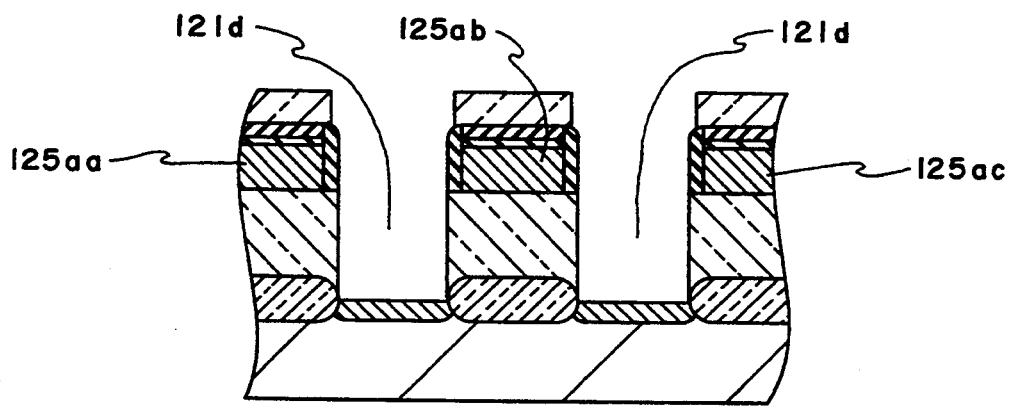

As the surface of a p-type silicon substrate 101, field oxide films 102 and gate oxide films 103 are formed, and then over the whole surface, a conductor film made from such as polycide is formed, and then a silicon oxide film and aluminium oxide film to be used as masks are formed. After that a series of etchings and ion implantations are performed to form n-type diffused layers 108a, 108b and word lines 124a, 124b, 124c, 124d, 124e. The top face of each word line is covered with silicon oxide film mask 113aa and aluminium oxide film mask 105aa, and the side faces are covered with aluminium oxide film spacers 107aa. Over the whole surface, a dielectric film 109a made of reflowed BPSG film is formed, and then self-aligned contact holes 111c extending down to diffused layers 108b are opened (FIGS. 7, 8A, 9A). The self-aligned contact hole 111c is a bit contact hole formed to be self-aligned with two word lines such as 124b, 124c.

In the next step, bit lines 125aa, 125ab, 125ac made of the second conductor film are formed. These bit lines are connected through self-aligned contact holes 111c to diffused layers 108b. The top face of each bit line 125aa is covered with silicon oxide film mask 113ba and aluminium film mask 105ba, and the side faces of bit line 125aa are covered with aluminium oxide film spacers 107ba. On the whole surface, a dielectric film 109b made of reflowed BPSG film is formed. Subsequently dielectric films 109b, 109a and gate oxide film 103 are in sequence etched, and self-aligned contact holes 121d extending down to diffused layers 108a are opened (FIGS. 7, 8B, 9B) which are node contact holes to be self-aligned with bit lines such as 125aa, 125ab.

Figure 9C:
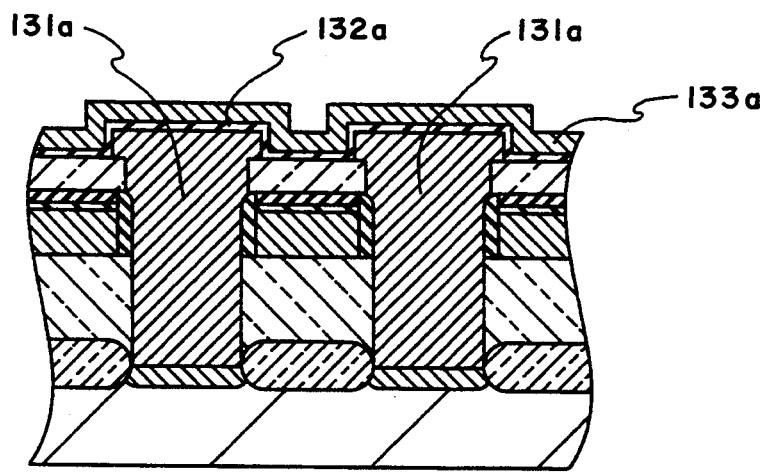

In the next step, a storage node electrode 131a connected through self-aligned contact holes 121d to diffused layers 108a is formed, and then a dielectric film 132a covering storage node electrode 131a is formed. Besides cell plate electrode 133a is formed (FIGS. 7, 8C, 9C). With formation of storage node electrode 131a, dielectric film 132a, and cell plate electrode 133a, the information storage stacked capacitor as the application example becomes completed.

Figure 10:
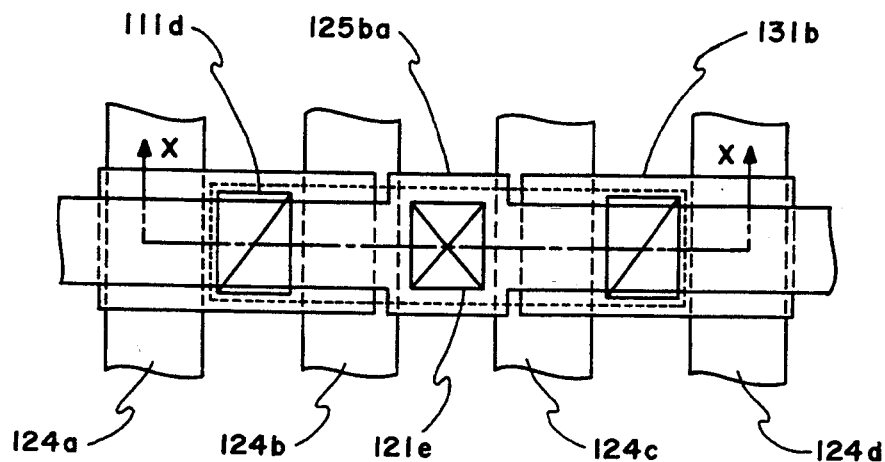
FIG. 10 is a fragmentary plan view of a semiconductor device as the second example to which the third embodiment is applied.
Figure 11A:
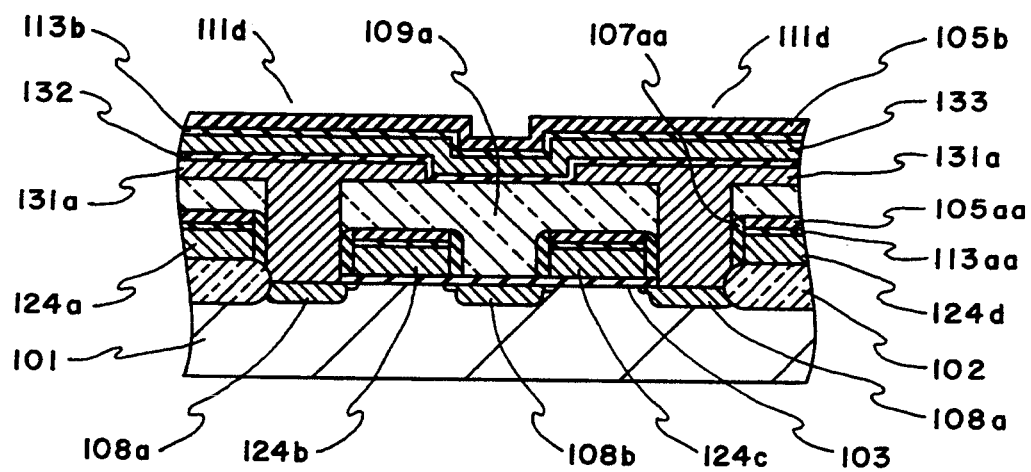
FIGS. 11A to 11C are schematic cross-sectional views in the processing steps of the semiconductor device as the second application example taken along line X—X of FIG. 7.
Figure 11B:
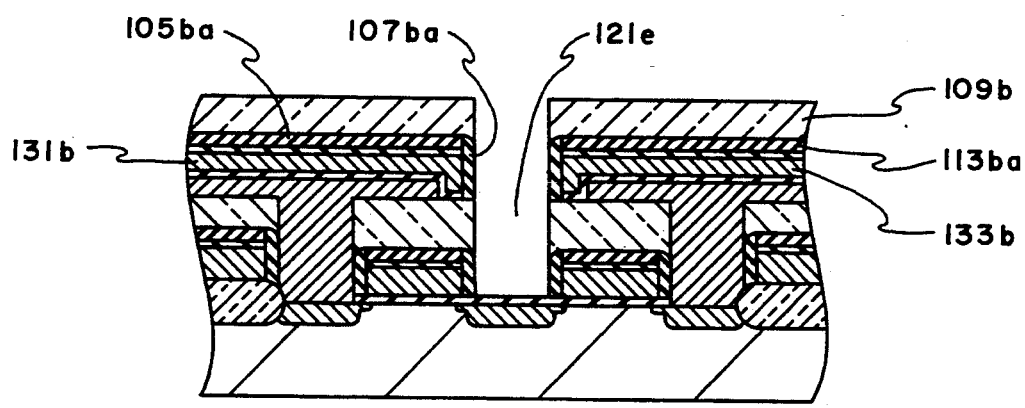
Figure 11C:
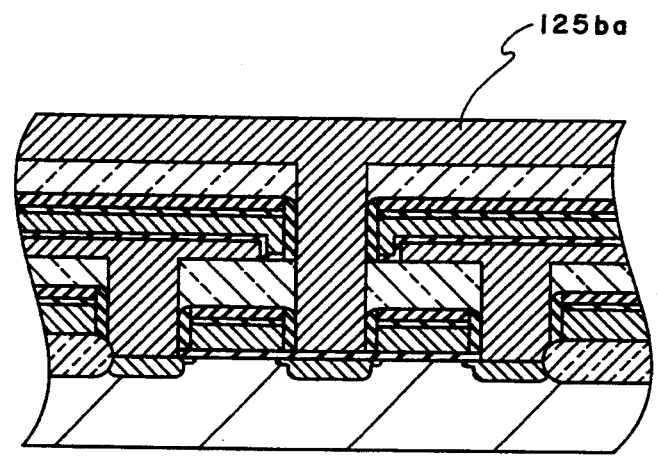

Referring to FIG. 10 showing the layout of self-aligned contact holes and FIGS. 11A to 11C illustrating in schematic cross-section view along line X—X of FIG. 10 in processing sequence, the second example to which the third embodiment is applied to a DRAM having an information-storage stacked capacitor and in which node contact holes and bit contact holes are self-aligned ones, bit lines being formed at the third-level, will be described below.

The same procedure as in the first application example described above proceeds till forming dielectric film 109a. Dielectric film 109a and gate oxide film 103 are etched in sequence to open self-aligned contact holes 111d extending down to diffused layers 108a, which are node contact holes formed to be self-aligned with two word lines such as 124a, 124b. Subsequently storage node electrodes 131a connected through self-aligned contact holes 111d to diffused layers 108a are formed, and then over the whole surface a dielectric film 132 is formed. Further the second conductor film 133, the second silicon oxide film 113b as a mask, and the second aluminium oxide film 105b as a mask are formed each over the whole surface of the former (FIGS. 10, 11A).

In the next step, the second aluminium film 105b as a mask, the second silicon oxide film 113b as a mask, the second conductor film 133, and dielectric film 132 are etched in sequence to open a hole (not shown) extending down to a diffused layer 108b. By this etching, simultaneously a cell plate electrode 133b consisting of aluminium oxide film mask 105ba, silicon oxide film mask 113ba, and the second conductor film is formed, and with this, information-storage stacked capacitor in this application example becomes completed. Besides aluminium oxide film spacers 107ba are formed on the side faces of cell plate electrode 133b (the side walls of the above-mentioned hole). Over the whole surface, the second dielectric film 109b is formed, and dielectric films 109b, 109a, and gate oxide film 103 are etched in sequence to open a self-aligned contact hole 121e extending down to diffused layer 108b (FIGS. 10, 11B) which serves as a bit contact hole and which is formed to be self-aligned with two word lines such as 124b, 124c and cell plate electrode 133b (the above-mentioned hole).

In the next step, over the whole surface the third conductor film is formed, which is patterned to form bit lines 125ba connected through a self-aligned contact hole 121e to diffused layer 108b (FIGS. 10, 11C).

As described above, the first and second application examples in which node contact holes and bit contact holes are formed as self-aligned contact holes contributes to reduction of memory cells of DRAM.

Figure 12A:
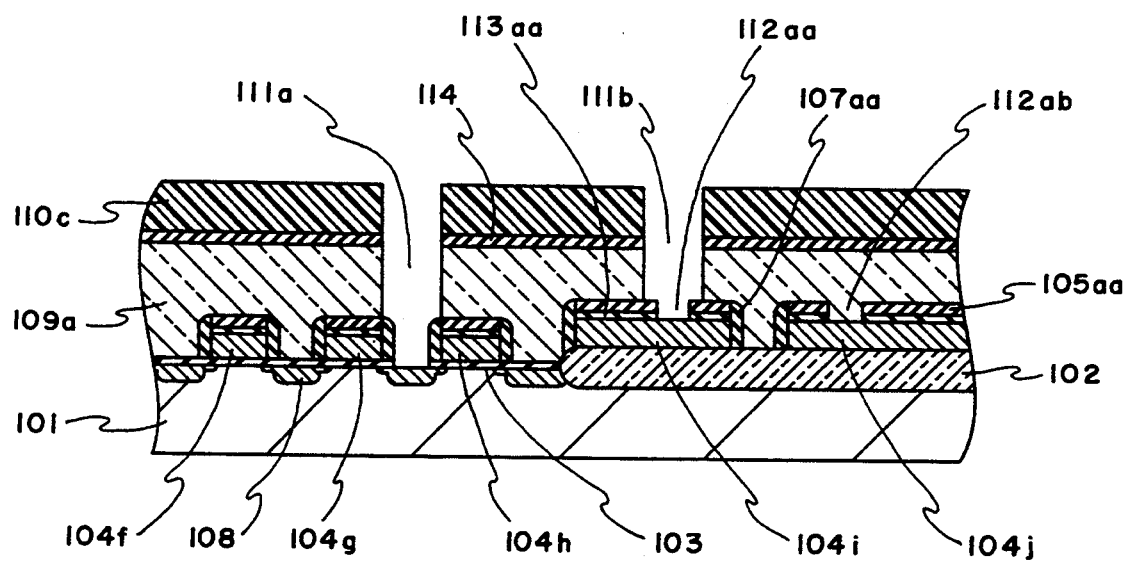
FIGS. 12A to 12C are schematic cross-sectional views of multilevel interconnection structure illustrating the processing steps in the fourth embodiment of the present invention.
Figure 12B:
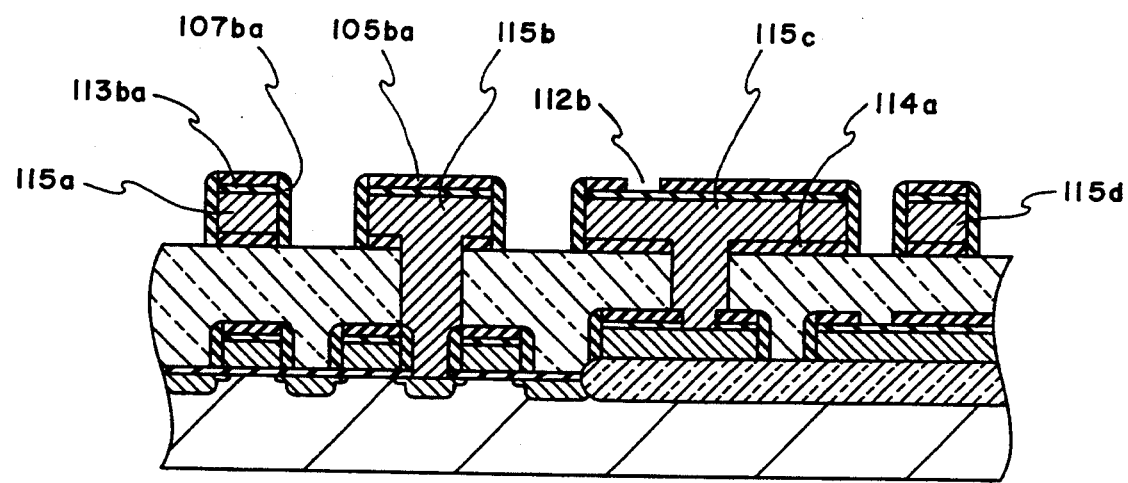
Figure 12C:
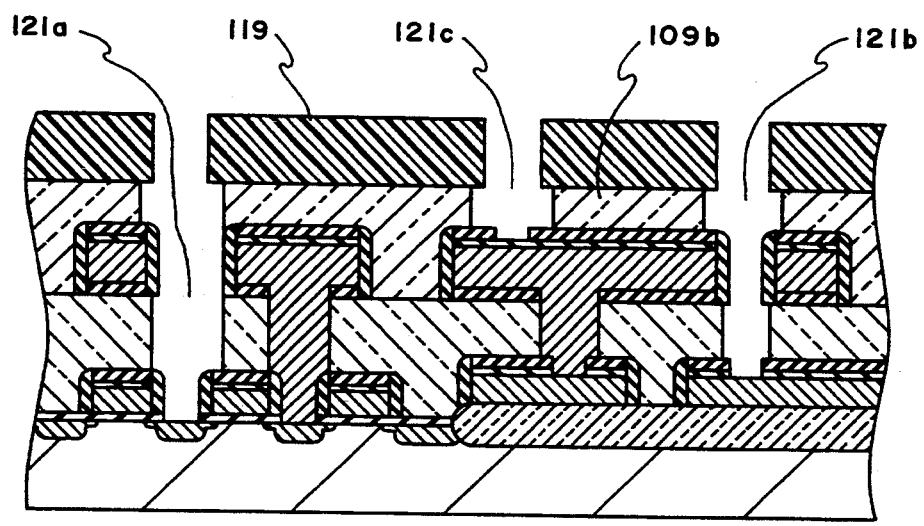

Referring to FIGS. 12A to 12C illustrating in fragmentary cross-section the method of forming self-aligned contact holes, the fourth embodiment of the present invention, which is a method of forming self-aligned contact holes in a semiconductor device, which has at least three-level interconnection structure and comprises MOS transistors, and in which aluminium oxide film pad is formed on the bottom face of at least the second-level line, will be described below.

The same procedure as the third example proceeds till forming aluminium oxide as a mask in which windows 112aa, 112ab are formed. Similarly gate electrodes 104f, 104g, 104h, 104i, 104j, aluminium oxide film mask 105aa, silicon oxide film mask 113aa, aluminium oxide film spacers 107aa, n-type diffused layers 108, and dielectric film 109a are formed. Over the whole surface a 100 nm-thick aluminium oxide film 114 as a pad is formed. Further a photoresist film 110c is formed, and then using this as a mask, aluminium oxide film 114, dielectric film 109a, silicon oxide film 113aa, and gate oxide film are etched to open self-aligned contact holes 111a, 111b (FIG. 12A).

After removing photoresist film 110c, the second conductor film, the second silicon oxide film as a mask, and the second aluminium oxide film as a mask are formed over the whole surface. After forming windows 112b in the second aluminium oxide as a mask, etching of the second aluminium oxide film as a mask, the second silicon oxide film as a mask, the second conductor film and aluminium oxide film as a pad 114 is performed in sequence. Thereby lines 115a, 115b, 115c, 115d made of the conductor film, aluminium oxide film mask 105ba, silicon oxide film mask 113ba, and aluminium oxide film pad 114a are formed. Etching of aluminium oxide film 114 as a pad is then carried out preferably with $BCl_3$. Aluminium oxide film spacers 107ba are formed on the side faces of these lines, respectively, (FIG. 12B).

In the next step, over the whole surface a dielectric film 109b and then a photoresist film 119 are formed. Using this photoresist film 119 as a mask, dielectric film 109b, silicon oxide film mask 113ba, dielectric film 109a, silicon oxide film mask 113aa, and gate oxide film are etched and then self-aligned contact holes 121a, 121b, 121c are opened (FIG. 12C). Self-aligned contact hole 121a connects between a third-level line and a diffused layer 108, and is self-aligned with gate electrodes 104f, 104g and with the second-level lines 115a, 115b. Self-aligned contact hole 121b connects between a third-level line and a gate electrode 104j, and is self-aligned with the second-level lines 115c, 115d. Self-aligned contact hole 121c connects a third-level line and second-level line 115c, and is self-aligned with window 112b.

This embodiment has as well as the effects of the third embodiment described earlier, unique effect when a plurality of self-aligned contact holes different in both type and depth is simultaneously formed. In this case, it takes a long time for etchings, which is accompanied by problem of making dielectric films susceptible to side etching, consequently to exposing the bottom face of the line. These problems however will not be serious even if the bottom face of the line is covered with aluminium oxide film pad because thereby isolation of the line from the interconnect filling the self-aligned contact hole can be secured. Long-time etching may result in appearance of reaction products from photoresist films, and others, which can be then readily removed after removing the photoresist film.

The first, second, third and fourth embodiments are of the method of forming self-aligned contact holes in a semiconductor device comprising n-channel MOS transistors. These should not be considered as limiting but the present invention can be applied to forming self-aligned contact holes in semiconductor devices comprising other transistors as of CMOS, bipolar, or BiCMOS.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A method of forming a semiconductor device comprising:
   forming a conductor film on an insulating film covering a semiconductor substrate, forming over the whole surface a silicon oxide film to be used as a mask, and then forming an aluminum oxide film as a mask;
   patterning said aluminum oxide film as a mask, said silicon oxide film as a mask, and said conductor film into the same geometry to form lines made of said conductor film, said silicon oxide film mask and said aluminum oxide film mask being formed on the top face of each line, forming windows in areas in said aluminum oxide film as a mask, so that said lines are formed through said windows;

forming over the whole surface, and etching back, an aluminum oxide film to form aluminum oxide film spacers on the side faces of each line;

forming diffused layers of a conductivity type in regions at the surface of said semiconductor substrate;

forming over the whole surface a silicon oxide dielectric film; and then performing anisotropic dry etching of said dielectric film with fluorocarbon gas in order to simultaneously form self-aligned contact holes extending downwardly through said windows to said diffused layers.

2. A method of forming the semiconductor device according to claim 1 wherein selectively formed field oxide films and gate oxide films are made of said silicon insulating film, said lines are gate electrodes, and said diffused layers are source/drain regions formed to be self-aligned with said gate electrode and said field oxide film.

3. A method of forming a semiconductor device comprising:

forming a conductor film on an insulating film covering a semiconductor substrate, forming an aluminum oxide film to serve as a pad on said silicon insulating film;

patterning said aluminum oxide film to be a mask and said silicon oxide film to be a mask, and said conductor film in the same geometry, and forming said aluminum oxide film as said pad and forming lines made of said conductor film, each line being provided on the top with a mask made of said aluminum oxide film;

said silicon oxide film mask and said aluminum oxide film mask being formed on the top faces of said lines, and said aluminum oxide film pad being formed on the side faces of said lines;

forming over the whole surface, and etching back, an aluminum oxide film to form aluminum oxide film spacers on the side faces of each line;

forming diffused layers of a conductivity type in regions at the surface of said semiconductor substrate; and forming over the whole surface a silicon oxide dielectric film and then performing anisotropic dry etching said dielectric film with fluorocarbon-related gas to form self-aligned contact holes extending down to said diffused layers.

* * * * *